March 10, 1964 S. N. ZILBERFARB 3,124,160
SEQUENTIAL FLUID AMPLIFIER
Filed June 29, 1962
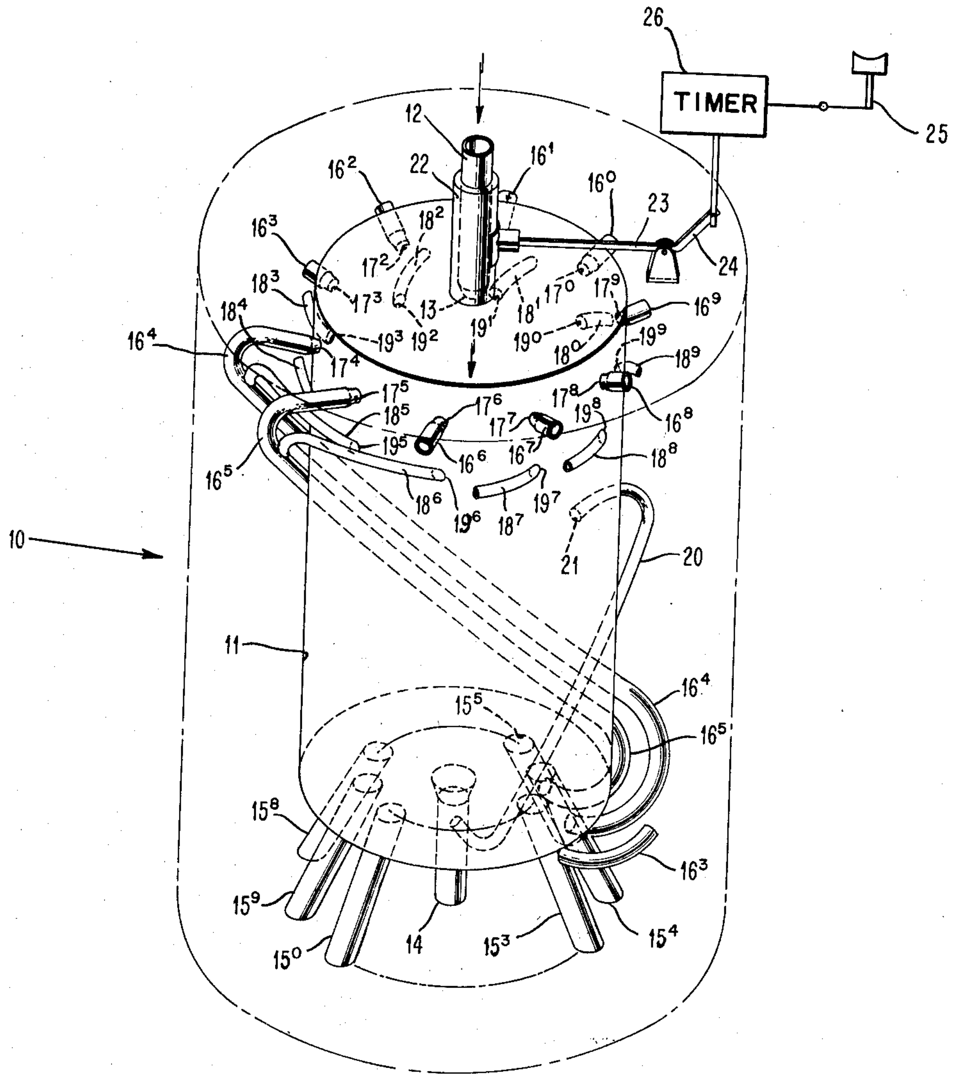
INVENTOR
SAUL N. ZILBERFARB
BY Griffin and Stokes
ATTORNEYS United States Patent Office 3,124,160

Patented Mar. 10, 1964

3,124,160

SEQUENTIAL FLUID AMPLIFIER

Saul N. Zilberfarb, Philadelphia, Pa., assignor to Sperry Rand Corporation, New York, N.Y., a corporation of Delaware Filed June 29, 1962, Ser. No. 206,270
19 Claims. (Cl. 137—610)

This invention relates to a multistable fluid amplifier having a sequential switching operation, and more particularly, to one wherein the switching is independent of the channel location of the main power stream.

The recent development of pure fluid amplifiers has been of importance to the data processing art because of their adaptability for inclusion within computing and control circuits of great ruggedness and intermediate repetition rates. The fundamental characteristic of the prior art fluid amplifier is that it is capable of a bistable mode of operation, as evidenced by the fact that the power stream may be deflected by a control stream into one of two output channels and there maintained even after termination of the control stream. Such an amplifier can be considered as a two dimensional device in that the power stream and control streams all lie in the same plane no matter what the angle of deflection of the former. The pure fluid amplifier of the prior art may be used in a manner analogous to the use of the bistable electronic flip-flop in those data processing systems where information is represented and characterized by electrical manifestations such as pulse trains and the like.

The present invention provides a pure fluid amplifier capable of assuming any one of a plurality of states greater than two. For example, three, four, or even ten individual output channels are provided into any one of which the power stream may be diverted by a selectively actuated control stream. By virtue of this characteristic the device may be used as a fluid pulse generator capable of producing fluid output pulses. Furthermore, this invention has the ability to sequentially switch through multistable states in that the power stream may be diverted to each of the output channels in a predetermined sequence. By virtue of this characteristic, the device may be utilized for counting in a radix greater than 2. Thus, in the preferred embodiment of the invention, a pure fluid amplifier is shown which has ten separate output channels each representing a different digit in the decimal system, with means for sequentially switching the power stream to each output channel in a defined sequence. Means are also provided to terminate the switching operation and maintain deflection of the power stream to a particular output channel.

It is therefore an object of the present invention to provide a pure fluid amplifier which obviates the limitations of bistable operation.

A further object of the invention is to provide a multistable pure fluid amplifying device capable of polynary computation.

Yet another object of the present invention is to provide a three dimensional, pure fluid amplifier having the ability to sequentially change through multistable states.

A further object of the invention is to provide a pure fluid amplifier capable of being used as pulse generator for producing fluid pulses.

These and other objects of the present invention will become apparent during the course of the following description, which should be read with reference to the drawing, in which the figure is a perspective view of the present invention.

As shown in the figure, the invention comprises a solid body 10 which contains a plurality of fluid passageways or channels therein for conducting fluid to or from a center interaction chamber 11. The fluid utilized in the invention may be either air or another gas, or water or another fluid, and is supplied by a pump or compressor not shown in the figure. Such fluid is initially applied as a power stream to the input of power stream passageway 12 whose exit is formed in the shape of a nozzle 13 through which the fluid enters chamber 11 in the direction indicated by the arrows. The power stream upon entering chamber 11 travels in a direction toward a drain or waste channel 14 which is symmetrically placed in the opposite end wall of chamber 11 and which returns the power stream fluid to the input of the supply pump.

Symmetrically arranged in a circle about output drain channel 14 are ten output channels $15^0$ through $15^9$. Any other total number N of output channels may be employed rather than ten. However, the disclosed embodiment of the present invention is here shown to be useful in the decimal system of counting, hence the identification of each channel 15 by a different one of the decimal digit superscripts 0 through 9. The power stream upon entering chamber 11 may be diverted into any one of these output channels by means subsequently to be described, and upon being diverted into an output channel can be maintained therein. Associated with each of the output channels $15^n$, where $n$ is any one of the decimal digits 0 through 9 in the following description but in the claims more generally is to be construed as any positive integer up to and including N in the case where the output channels are identified as $15^1$ through $15^N$, is a positive feedback control stream channel $16^n$ one of ten (N) such channels which bleeds off a portion of the power stream in channel $15^n$ and returns same to an orifice $17^n$ in the wall of chamber 11, so that the control stream exiting from said orifice $17^n$ impinges upon the power stream exiting from nozzle 13 and causes the latter to continue to flow into its associated channel $15^n$. For example, orifice $17^5$ receives fluid from output channel $15^5$ via control stream channel $16^5$ in order to maintain power stream flow into output channel $15^5$. Elements $15^6$, $16^6$ and $17^6$ are similarly associated one with the other, as are $15^7$, $16^7$ and $17^7$, and so on for all remaining elements $15^n$, $16^n$ and $17^n$.

Each of the positive feedback channels $16^n$ has associated therewith a smaller subpath $18^{n+1}$ through which flows a switching control stream which exits into chamber 11 via a respective orifice $19^{n+1}$. Thus, in the figure the channel $16^0$ has bled off therefrom a smaller channel $18^1$ which exits into chamber 11 through orifice $19^1$ positioned directly beneath orifice $17^1$. Similarly, channel $18^2$ is bled from channel $16^1$ to orifice $19^2$, $18^3$ from $16^2$ to $19^3$, and so on for the remaining elements $18^{n+1}$, $16^n$, and $19^{n+1}$. From drain channel 14 is bled a reset channel 20 through which flows a reset fluid which exits into chamber 11 via an orifice 21 positioned below the orifices $17^0$ and $19^0$. This reset stream is used to cause the power stream to initially flow into a predesignated one of channels 15, which for the purpose of this description, happens to be channel $15^0$. Channel 20 acquires fluid from drain channel 14 which in turn receives fluid from one or both of two sources. Its continual source is the system waste fluid which is present even when the vast bulk of the power stream is flowing into one of the output channels 15. The energy of the reset stream, due to this system waste fluid, is quite small. However, if the power stream is not permitted to be diverted into one of the output channels 15 (by means subsequently to be described), then the power stream in almost its entirety flows into channel 14. The reset control stream in this case acquires high energy when the undeflected power stream flows directly into drain channel 14. Until this latter action occurs, however, the reset control stream in channel 20 has but low energy.

The output channels 15 are arranged about the center drain channel 14 and depart from chamber 11 at an angle with respect to the longitudinal axis of said chamber. The positive feedback channels $16^0$ through $16^9$ are shown bled from respective output channels $15^0$ through $15^9$, with each said channel 16 initially having a portion of its length in a plane positioned below the end wall of chamber 11. This initial portion of each passageway 16 has several bends each of fairly large radius to permit smooth flow of the fluid therein. Each channel 16 then rises to a second plane which intersects chamber 11 near the end thereof from whence the power stream emerges. Several more bends are taken by each passageway 16 before terminating in a nozzle having orifice 17 in the side wall of chamber 11. Each orifice $17^n$ associated with passageway $16^n$ enters chamber 11 at a point in the chamber side wall 180 horizontal degress removed from the inlet to output channel $15^n$ from whence channel $16^n$ is bled. In the preferred embodiment of the invention, which can be utilized as a counting device in the decimal system (but is not limited thereto), there are ten such output channels 15 and consequently ten positive feedback channels 16 which are spaced about chamber 11 in the manner indicated. Thus, this symmetrical arrangement provides for a switching of the power stream through 360 degrees.

As before described, a second and smaller subchannel 18 is bled from each of the channels 16. In particular, each channel 18 is tapped from passageway 16 at an upper plane, after which it terminates in the side wall of chamber 11 in the orifice 19, such that the row of orifices 19 is downstream from the row of orifices 17. A control stream emerging from an orifice $19^n$ is directed against the power stream and is thus able to divert said power stream, under certain conditions, into the output channel $15^n$ which is diametrically opposite from the orifice $19^n$. For example, a control fluid stream emerging from orifice $19^0$ will impinge upon the power stream and tend to divert same into output channel $15^0$. However, it will be observed that a control stream in channel $18^0$ is derived from a control stream in channel $16^9$ which in turn exits through orifice $17^9$. Thus, whenever there is fluid flow within one of the passageways $16^n$, there will be a control stream emerging from its associated orifice $17^n$ as well as a switching control stream emerging from the orifice $19^{n+1}$. Each said control stream tends to respectively divert the power stream into a different one of adjacent output channels $15^n$ and $15^{n+1}$. Furthermore, any fluid of the power or control streams which fails to enter the output channel $15^n$ will flow into drain channel 14, with a portion of this waste fluid being thereafter fed back via channel 20 to emerge from reset orifice 21.

Each control stream from an orifice $17^n$ is designed to have a greater force than the sum of the forces contributed by the control stream from the corresponding sub-channel orifice $19^{n+1}$ and the low energy stream from reset orifice 21. This greater force is such that it overrides the effect of the switching and reset control streams so that the power stream is shifted into output channel $15^n$. Thus, if the power stream is directed into an output channel $15^n$, it will be maintained therein by the control stream from orifice $17^n$ notwithstanding the fact that control streams from orifices $19^{n+1}$ and 21 also impinge thereon. In this case, the device is said to be stable in that the power stream can be maintained in a selected output channel $15^n$ for as long as desired assuming that the control stream from orifice $17^n$ is not terminated. In order to switch the power stream from an output channel $15^n$ to channel $15^{n+1}$, it is merely necessary to interrupt the control stream from orifice $17^n$ so that the switching stream from orifice $19^{n+1}$ now takes control and shifts the power stream into the next sequential output channel $15^{n+1}$. It should here be mentioned that the control stream from orifice $19^{n+1}$ should also have greater energy content than does the reset stream from orifice 21 in its low energy condition. When once the power stream has been shifted from output channel $15^n$ to channel $15^{n+1}$, fluid flow within channel $16^n$ ceases whereas flow in channel $16^{n+1}$ commences. Control streams now emerge from orifices $17^{n+1}$ and $19^{n+2}$, with the former overriding any effect of the latter so as to maintain the power stream in output channel $15^{n+1}$.

If means are provided in the device to block the effect of both the maintaining and switching control streams from orifices $17^n$ and $19^{n+1}$, respectively, then the power stream cannot be diverted into any of the output channels 15. Instead, it will continue on its original course from orifice 13 until it flows into drain channel 14 at substantially full power. In this event, the energy of the fluid in channel 20 is sufficient to enable the control stream from orifice 21 to shift the power stream into a predesignated output channel to thereby reset the device to an initial condition. As mentioned before, and as shown in the figure, orifice 21 is positioned in the side wall of chamber 11 at a position 180 horizontal degrees from the entrance to channel $15^0$. Therefore, the initial reset condition of the present device occurs when the power stream is diverted into channel $15^0$.

As mentioned previously, in order to effect a cycling of the power stream from an output channel $15^n$ to another output channel $15^{n+1}$, an interruption of the effect of the control stream from orifice $17^n$ must be achieved. The figure illustrates mechanical means for performing this function which comprise in part a cylindrical hollow sleeve 22 surrounding the power jet channel 12. Interruption is accomplished by displacement of sleeve 22 to an intermediate position so as to block the impingement of a control stream from any orifice $17^n$ on the power stream. However, displacement of sleeve 22 to this position will not prevent a control stream from orifice $19^{n+1}$ from striking the power stream. Therefore, if a control stream from orifice $17^n$ is blocked from impinging upon the power stream, the control stream from orifice $19^{n+1}$ is effective to shift the power stream into the next adjacent output channel $15^{n+1}$. If sleeve 22 is then subsequently moved back to its original unextended position as shown in the figure, the now present control stream from orifice $17^{n+1}$ is able to strike the power stream and maintain it in output channel $15^{n+1}$. However, if sleeve 22 remains in its intermediate displaced position, then the control stream from orifice $19^{n+2}$ will subsequently shift the power stream from output channel $15^{n+1}$ to channel $15^{n+2}$. Thus, as long as sleeve 22 remains in its displaced position to thereby block the shifting effect of all control streams from orifices 17, the successive outputs from orifices 19 will sequentially shift the power stream from one output channel to another. As soon as the power stream has been shifted to the desired output channel $15^n$, sleeve 22 is raised so that the control stream from the associated orifice $17^n$ can impinge upon the power stream and thus prevent any further shifting of the latter until sleeve 22 is once again lowered.

Sleeve 22 may be actuated by external means schematically represented, for example, by the lever arm 23 and bell crank 24 arrangement, wherein force is applied to this mechanical linkage either manually and/or remotely. For example, a keyboard 25 may be attached to a timing mechanism 26, such that the sleeve motion interruption is programmed to correspond to the time required for the power stream to switch from channel to channel. Due to the finite length of channels 16 and 18, some finite time is required between the initial entry of the power stream into an output channel $15^n$ and the emergence of the control stream from the associated orifice $19^{n+1}$. When a shift of more than one channel is desired for each lowering of sleeve 22, the sleeve remains lowered in its intermediate blocking position until the desired sequential shifting time has elapsed. However, the keyboard is not to be construed as limitive of environments in which the invention may be utilized.

When it is desired to reset the fluid amplifier so that the power stream is deflected into output channel $15^0$, sleeve 22 is displaced to an extreme lower position of its stroke so that control streams from both orifices $17^n$ and $19^{n+1}$ are blocked from impinging upon the power stream. In this case the power stream now flows into the center drain channel 14. After a certain finite delay, the increased energy in channel 20 is reflected by the increased energy in the control stream from orifice 21 so as to shift the power stream into output channel $15^0$. If sleeve 20 is then retracted to its original unextended position, the control stream from orifice $17^0$ is now effective to maintain the power stream in this channel until sleeve 22 is lowered to its intermediate position to cause a shift.

In recapitulation, it may be stated that the device shown in the figure is designed to shift the power stream from one channel $15^n$ to another channel $15^{n+1}$ in a sequential manner by means of a control stream from orifice $19^{n+1}$ which is self-generated from the channels $15^n$ and $16^n$ presently containing the flow. Each positive feedback channel $16^n$ selectively provides a control stream of sufficient force to maintain the power stream in its associated output channel $15^n$, while the control stream of the subchannel $18^{n+1}$ is directed so as to cause the power stream to be deflected to the next channel $15^{n+1}$ in sequence upon the inhibiting of the effect of the former. Furthermore, means are provided to reset the device so that the power stream is deflected into a predesignated one of the output channels which thus acts as the first channel of the sequence. By extending the duration of the input pulse (as measured by the length of time that sleeve 22 is in its intermediate displaced position), the device can be made to shift through more than one of its sequential states which thus effects a rotary motion of the power stream about chamber 11.

Amplification is accomplished in the device because of the relatively small amount of control stream power required to deflect the power stream, thus allowing the energy of the power stream as it emerges from a channel $15^n$ to be utilized in driving other fluid amplifiers of the system. Furthermore, since the device has a minimum of moving mechanical parts, it consequently has higher reliability. Alternatively, pure fluid means might be provided to interrupt the control streams in channels 16 or 18. The invention may be provided with fewer (or more) output channels depending upon the environment in which it is to be placed. For example, two output channels could be provided if the device is to have a radix of two. Furthermore, it is possible to couple several of the units together as a decade counter. Such an arrangement is made possible because of the inherent sequential response of the device regardless of which channel the power stream happens to be in at the onset of interruption. Furthermore, the device lends itself readily for use as pulse generator capable of producing fluid pulses. It will therefore be apparent that many modifications and alterations may occur to one skilled in the art without departing from the spirit of the invention as defined in the appended claims.

I claim:

1. A pure fluid device comprising: a chamber, a power orifice in one end of said chamber adapted to direct a fluid power stream into said chamber, a plurality of N output channels, wherein N is a positive integer specifying the total number with $n$ being any positive integer up to and including N, opening from said chamber at locations down stream from said power orifice, a group of N first control orifices arranged in the wall of said chamber with each $n$th first control orifice adapted to direct a first fluid control stream into said chamber to impinge upon and deflect said power stream into the $n$th output channel, a group of N second control orifices in the wall of said chamber with each $n$th second control orifice adapted to direct a second fluid stream into said chamber to impinge upon and deflect said power stream into the $n$th output channel, first means responsive to the power stream flow in the $n$th output channel to provide a first control stream to the $n$th first control orifice, second means responsive to the power stream flow in the $n$th output channel to provide a second control stream to the $(n+1)$th second control orifice, where the relative energies of said first and second control streams are such that the former determines the deflection of said power stream even during the presence of the latter, and means to selectively interrupt the deflecting effect of any first control stream which is deflecting said power stream.

2. A fluid device according to claim 1 wherein said first and second control orifices and said output channels are circumferentially arranged about the flow axis of said power stream, with each $n$th control orifice being approximately 180 horizontal degrees opposed to its associated $n$th output channel.

3. A fluid device according to claim 1 wherein the axial location of said first control orifices along said power stream differs from the axial location of said second control orifices.

4. A fluid device according to claim 1 wherein said second control orifices are located downstream along said power stream from said first control orifices.

5. A fluid device according to claim 1 wherein said interrupting means comprises a mechanical barrier interposed between a first control orifice and said power stream.

6. A fluid device according to claim 5 wherein said second control orifices are located downstream along said power stream from said first control orifices.

7. A fluid device according to claim 1 wherein said interrupting means comprises a mechanical barrier simultaneously interposed between all of said first control orifices and said power stream.

8. A fluid device according to claim 7 wherein said mechanical barrier is a hollow sleeve enclosing said power stream and longitudinally movable therewith.

9. A fluid device according to claim 7 wherein said second control orifices are located downstream along said power stream from said first control orifices.

10. A fluid device according to claim 1 wherein N equals 10.

11. A pure fluid device comprising: a chamber, a power orifice in one end of said chamber adapted to direct a fluid power stream into said chamber, a plurality of N output channels, wherein N is a positive integer specifying the total number with $n$ being any positive integer up to and including N, opening from said chamber at locations downstream from said power orifice, a group of N first control orifices arranged in the wall of said chamber with each $n$th first control orifice adapted to direct a first fluid control stream into said chamber to impinge upon and deflect said power stream into the $n$th output channel, a group of N second control orifices arranged in the wall of said chamber with each $n$th second control orifice adapted to direct a second fluid control stream into said chamber to impinge and deflect said power stream into the $n$th output channel, a group of first feedback fluid channels connected one between the $n$th output channel and the $n$th first control orifice to provide a first control stream to the latter, a group of second feedback fluid channels connected one between the $n$th output channel and the $(n+1)$th second control orifice to provide a second control stream to the latter, where the relative energies of said first and second control streams are such that the former determines the deflection of said power stream even during the presence of the latter, and means to selectively interrupt the deflecting effect of any first control stream which is deflecting said power stream.

12. A fluid device according to claim 11 wherein N equals 10.

13. A fluid device according to claim 11 wherein said first and second control orifices and said output channels are circumferentially arranged around the flow axis of said power stream, with each $n$th control orifice being approximately 180 horizontal degrees opposed to its associated $n$th output channel.

14. A fluid device according to claim 11 wherein the axial location of said first control orifices along said power stream differs from the axial location of said second control orifices.

15. A fluid device according to claim 11 wherein said second control orifices are located downstream along said power stream from said first control orifices.

16. A fluid device according to claim 11 wherein said interrupting means comprises a mechanical barrier interposed between a first control orifice and said power stream.

17. A fluid device according to claim 16 wherein said second control orifices are located downstream along said power stream from said first control orifices.

18. A fluid device according to claim 11 wherein said interrupting means comprises a mechanical barrier simultaneously interposed between all of said first control orifices and said power stream.

19. A fluid device according to claim 18 wherein said mechanical barrier is a hollow sleeve enclosing said power stream and longitudinally movable therewith.

References Cited in the file of this patent

UNITED STATES PATENTS

| | | |
|---|---|---|
| 3,016,063 | Hausmann | Jan. 9, 1962 |
| 3,039,490 | Carlson | Jan. 16, 1962 |